US010134876B2

(12) United States Patent
Krishnan et al.

(10) Patent No.: US 10,134,876 B2
(45) Date of Patent: Nov. 20, 2018

(54) FINFETS WITH STRAINED CHANNELS AND REDUCED ON STATE RESISTANCE

(71) Applicant: GLOBALFOUNDRIES INC., Grand Cayman (KY)

(72) Inventors: Bharat V. Krishnan, Mechanicville, NY (US); Timothy J. McArdle, Ballston Lake, NY (US); Rinus Tek Po Lee, Ballston Spa, NY (US); Shishir K. Ray, San Diego, CA (US); Akshey Sehgal, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/475,873

(22) Filed: Mar. 31, 2017

(65) Prior Publication Data

US 2018/0286982 A1    Oct. 4, 2018

(51) Int. Cl.
| H01L 27/088 | (2006.01) |
| H01L 21/336 | (2006.01) |
| H01L 29/66 | (2006.01) |
| H01L 29/417 | (2006.01) |
| H01L 29/78 | (2006.01) |

(52) U.S. Cl.
CPC .. *H01L 29/66795* (2013.01); *H01L 29/41791* (2013.01); *H01L 29/7848* (2013.01)

(58) Field of Classification Search
CPC .................................................. H01L 29/66795
USPC ........................................ 438/283; 257/401
See application file for complete search history.

(56) References Cited

U.S. PATENT DOCUMENTS

| 7,303,949 B2 | 12/2007 | Chen et al. |
| 8,440,517 B2 | 5/2013 | Lin et al. |
| 9,728,644 B2 * | 8/2017 | Tak ...................... H01L 29/7851 |
| 2015/0194307 A1 | 7/2015 | Gaire et al. |

* cited by examiner

*Primary Examiner* — Calvin Lee
(74) *Attorney, Agent, or Firm* — Francois Pagette; Andrew M. Calderon; Roberts Mlotkowski Safran Cole & Calderon, P.C.

(57) ABSTRACT

The present disclosure generally relates to semiconductor structures and, more particularly, to finFETs with strained channels and reduced on state resistances and methods of manufacture. The structure includes: a plurality of fin structures comprising doped source and drain regions with a diffusion blocking layer between the doped source and drain regions and an underlying fin region formed within dielectric material.

15 Claims, 5 Drawing Sheets

FINFETS WITH STRAINED CHANNELS AND REDUCED ON STATE RESISTANCE

FIELD OF THE INVENTION

The present disclosure generally relates to semiconductor structures and, more particularly, to finFETs with strained channels and reduced on state resistance and methods of manufacture.

BACKGROUND

With semiconductor scaling, parasitic external resistance can pose significant challenges to achieving device performance. To increase performance, a channel strain can be placed on the device; however, it has been found that significant strain, e.g., approximately 50% of cSiGe strain, can be lost through cavity etching processes needed for source and drain formation. Some of the strain loss can be recovered, but such recovery is not a simple process.

For example, strain loss can be partially recovered by using embedded source and drain epitaxial processes. Alternatively, strain loss can be prevented using cladding techniques. However, cladding might not provide enough dopant source for lowering Ron. More specifically, with cladding processes, there is not enough SiGe:B volume to provide a junction overlap.

SUMMARY

In an aspect of the disclosure a structure comprises: a plurality of fin structures comprising doped source and drain regions with a diffusion blocking layer between the doped source and drain regions and an underlying fin region formed within dielectric material.

In an aspect of the disclosure a structure comprises: a first plurality of fin structures comprising: a fin region composed of a first material in a dielectric material; doped source and drain regions above the dielectric material; and a diffusion blocking layer between the fin region and the doped source and drain regions; and a second plurality of fin structures devoid of the blocking layer.

In an aspect of the disclosure a method comprises: forming a plurality of fins; forming a diffusion blocking layer on exposed surfaces of the plurality of fins; growing an epitaxial layer on the diffusion blocking layer; doping the epitaxial layer with a dopant; and forming source and drain regions from the doped epitaxial layer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to finFETs with strained channels and reduced on state resistance and methods of manufacture. In embodiments, the finFET structures include a blocking layer, e.g., SiC layer, which prevents diffusion of source and drain dopants into the lower portions of the finFET structures. Advantageously, by providing such blocking layer, the structures and methods described herein preserve strain post source and drain (S/D) formation, while also allowing for increased doping for Rext reduction.

More specifically, the finFET structures described herein include an SiC diffusion blocking layer formed as a part of the fin structure. The SiC diffusion blocking layer will prevent dopants used for the source and drain regions from diffusing into the fin structures, mitigating strain loss that would otherwise occur due to S/D recess reactive ion etching (RIE) processes. In addition, the diffusion blocking layer and methods described herein reduce on state resistance due to an increased boron source for the junction; whereas, typical cladded S/D epitaxial processes cannot provide sufficient boron (or other dopants). The processes described herein are also simple to implement with minimal disruption to process flow, while providing multiple alternatives to simplify integration options.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
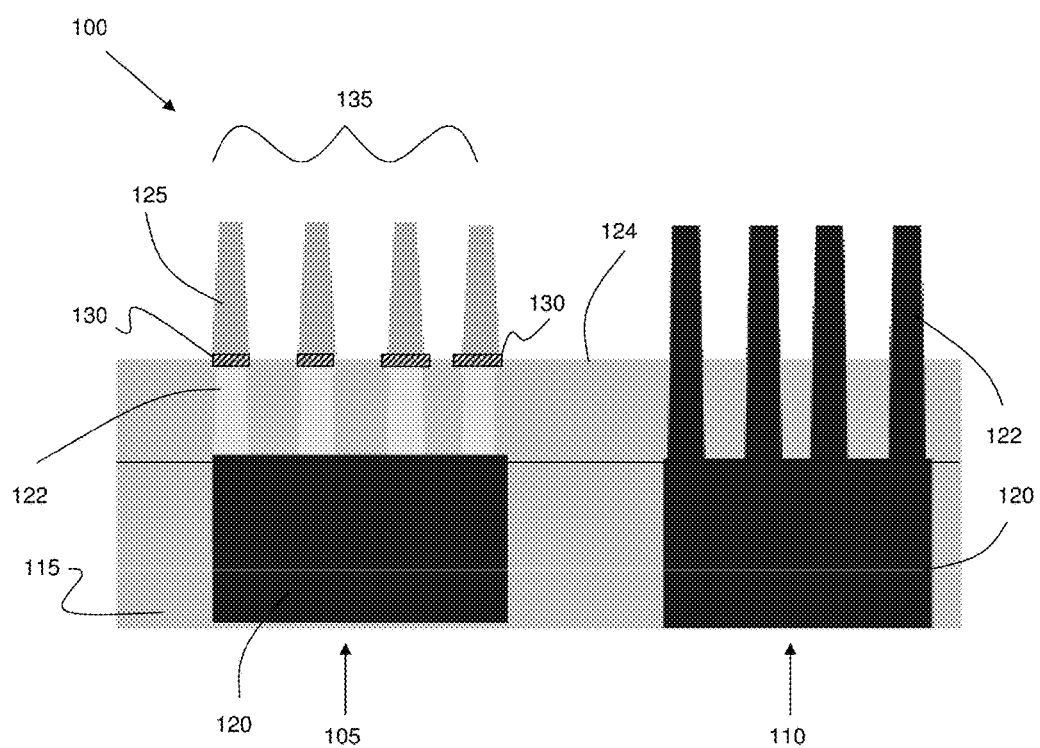
FIG. 1 shows a fin structure, amongst other features, and respective fabrication processes in accordance with aspects of the present disclosure.

FIG. 1 shows a structure and respective fabrication processes in accordance with aspects of the present disclosure. More specifically, FIG. 1 illustrates a finFET structure 100 comprising a PFET region 105 and an NFET region 110, separated by a shallow trench isolation structure (STI) 115, e.g., oxide material, formed in a substrate 120. In embodiments, the substrate 120 can be any appropriate semiconductor material, e.g., bulk Si, SiGe, SiGeC, SiC, GaAs, InAs, InP, and other III/V or II/VI compound semiconductors.

The STI 115 can be formed prior to or after the formation of fin structures 122. For example, the STI 115 can be formed by conventional lithography, etching and deposition processes known to those of skill in the art. In these processes, a resist formed over the substrate 120 is exposed to energy (light) to form a pattern (opening). An etching process with a selective chemistry, e.g., reactive ion etching (RIE), will be used to form one or more trenches in the substrate 120 through the openings of the resist. The resist can then be removed by a conventional oxygen ashing process or other known stripants. Following the resist removal, the oxide material can be deposited by any conventional deposition processes, e.g., chemical vapor deposition (CVD) processes. Any residual material on the surface of the substrate 120 can be removed by conventional chemical mechanical polishing (CMP) processes. In embodiments, the STI 115 can also be formed post fin structure formation.

Still referring to FIG. 1, the fin structures 122 are formed from the substrate material by using conventional patterning processes. For example, in embodiments, the fin structures 122 can be formed by conventional sidewall image techniques (SIT). In an example of a SIT technique, a mandrel material, e.g., $SiO_2$, is deposited on the substrate using conventional CVD processes. A resist is formed on the mandrel material, and exposed to light to form a pattern (openings). A reactive ion etching is performed through the openings to remove portions of the mandrel material in order to form the mandrels. In embodiments, the mandrels can have different widths and/or spacing depending on the desired dimensions. Spacers are formed on the sidewalls of the mandrels which are preferably material that is different than the mandrels, and which are formed using conventional deposition processes known to those of skill in the art. The spacers can have a width which matches the dimensions of the narrow fin structures 122, for example. The mandrels are removed or stripped using a conventional etching process, selective to the mandrel material. An etching is then performed within the spacing of the spacers to form the sub-lithographic features. The sidewall spacers can then be stripped.

An oxide material 124 e.g., a dielectric material, is deposited on the fin structures over the PFET region 105 and NFET region 110, respectively. Following the deposition process, the oxide material 124 can be partially recessed using conventional selective etchant processes, e.g., RIE process, to reveal upper portions of the fin structures 122 on both the PFET region 105 and NFET region 110. Alternatively, the oxide material 124 and STI 115 can both be formed post fin structure formation.

In any scenario, though, portions of the fin structures 122 on the PFET region 105 can be removed, followed by formation of, e.g., exposed fin structures 135 on the PFET region 105. The remaining portions of the fin structures 122 on the PFET region 105 will form an underlying fin region within the dielectric material 124. During this fin removal process, the fin structures 122 on the NFET region 110 will remain protected by, e.g., a hardmask, while a selective etching process will remove upper portions of the fin structures on the PFET region 105, above the dielectric material 124. It should be understood by those of skill in the art that the exposed fin structures 135 can be formed on the NFET region 110; instead of the PFET region 105. In addition, the exposed fin structures 135 can be formed in different directions and, as such, the present disclosure should not be limited to only the presently described structure.

Referring still to FIG. 1, in embodiments, the exposed fin structures 135 can be formed as part of a post fin reveal and dummy gate formation or by a replacement growth process, e.g., growing of diffusion blocking material 130 followed by an upper material region 125. For example, in embodiments, the exposed fin structures 135 include forming a diffusion blocking material 130 on the surfaces of the recessed fin structures 122 on the PFET region 105, followed by epitaxial growth of upper region material 125, e.g., SiGe or other semiconductor material. It should be recognized that the fin structures 122 within the dielectric material 124, below the diffusion blocking material 130, is generally an underlying fin region. In embodiments, the diffusion blocking material 130 is composed of, e.g., silicon carbide (SiC), which, as should be understood by those of skill in the art, will prevent diffusion of dopants into the lower portion of the fin structures 135 (e.g., portions of the fin structures below the blocking material 130), which is performed in subsequent source/drain formation processes.

In embodiments, the diffusion blocking material 130 can be grown by an epitaxial growth process to a thickness of about 1 nm to about 5 nm; although other dimensions are also contemplated herein. The upper region material 125 of the exposed fin structures 135, e.g., SiGe, can be grown on the diffusion blocking material 130 on the PFET region 105 of the structure. The upper region material 125 can be grown to a height of about 35 nm to about 50 nm to form the exposed fin structures 135; although other dimensions are also contemplated herein.

Figure 2A:
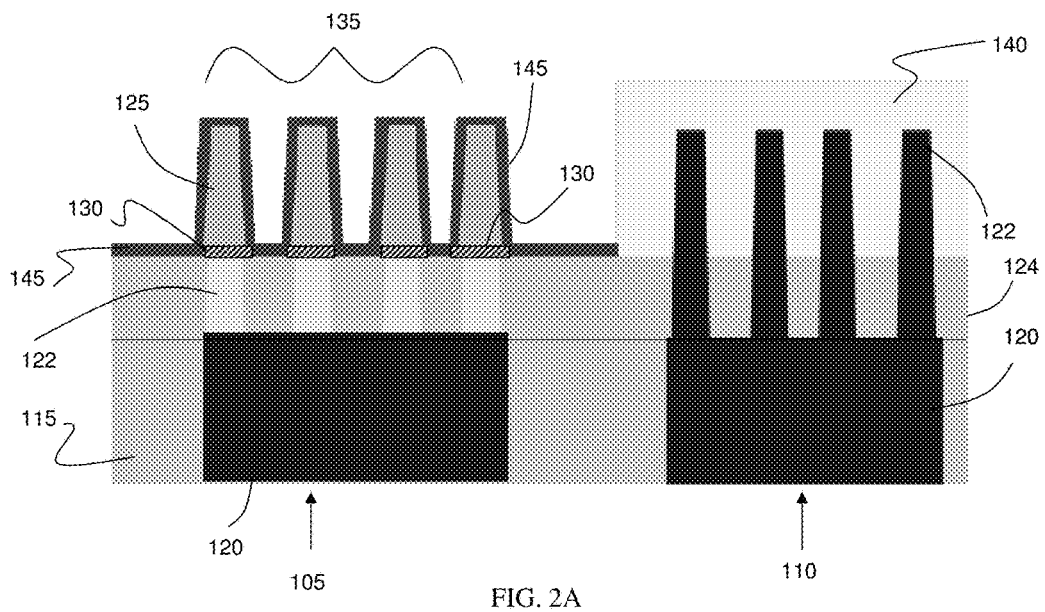
FIG. 2A shows the structure of FIG. 1 with a doping layer applied on exposed portions of the fin structures, amongst other features, and respective fabrication processes in accordance with aspects of the present disclosure.

FIG. 2A shows the structure of FIG. 1 with a doping layer applied on the exposed fin structures 135, amongst other features, and respective fabrication processes in accordance with aspects of the present disclosure. More specifically, in FIG. 2A, a hardmask 140 is deposited on the fin structures 122 on the NFET region 110 of the structure. A doping material 145 is formed on the exposed fin structures 135 of the PFET region 105. That is, in embodiments, the doping material 145 is formed on the upper or exposed portions, e.g., above the blocking layer 130, of the fin structures 135 of the PFET region 105. In embodiments, the doping material 145 can be a Borosilicate glass (BSG), and more specifically, can be composed of boron doped $SiO_2$. As an example, the thickness of the doping material 145 can be in a range of about 3 nm to about 5 nm; although other dimensions are also contemplated herein. In embodiments, the hardmask 140 will prevent the doping layer 145 from forming on the fin structures 122 on the NFET region 110.

Still referring to FIG. 2A, the deposition of the doping material 145 can occur by various deposition processes, e.g., chemical vapor deposition (CVD), sub-atmospheric CVD (SACVD), or atomic layer deposition (ALD). Regardless of the deposition process, the doping material 145 can be driven into the exposed portions, e.g., SiGe region 125, of the fin structures 135 on the PFET region 105, above the diffusion blocking material 130. For example, the dopants can be driven into the exposed fin structure 135 by an annealing process, e.g., at a temperature in a range of about 300-1100° C., for a duration in a range of about 5-30 minutes. This annealing process can be followed by removal of an oxide layer using a conventional cleaning process. The diffusion blocking layer 130 will prevent diffusion of the dopants into the lower portion of the fin structures 135 on the PFET region 105.

Figure 2B:
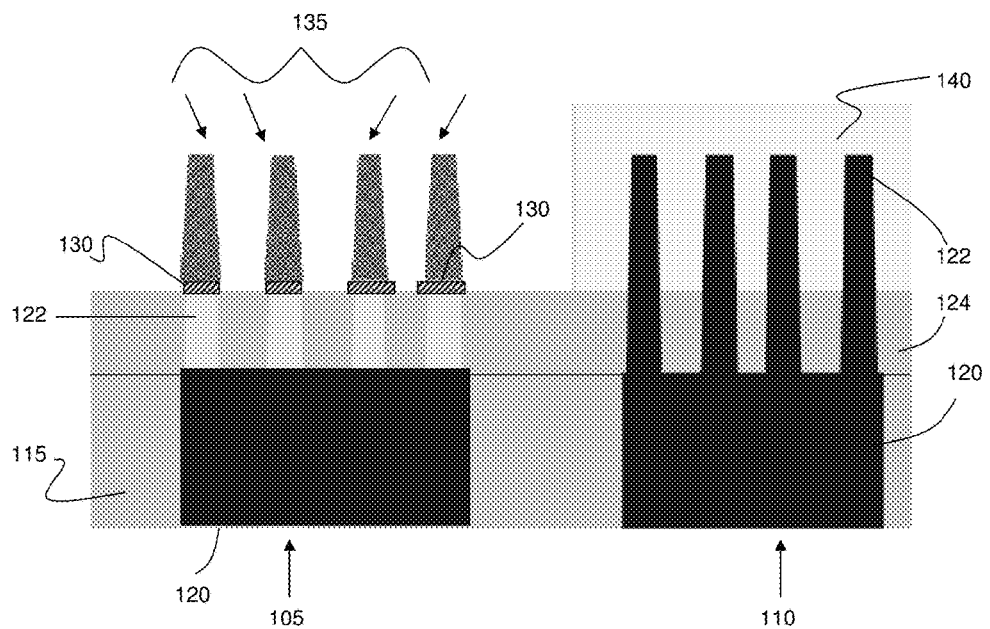
FIG. 2B shows an alternative structure with doped fin structures, amongst other features, and respective fabrication processes in accordance with aspects of the present disclosure.

Alternatively, as shown in FIG. 2B, doping of the exposed fin structures 135 can occur by an ion plasma doping process. In this process, the hardmask 140 is deposited on the fin structures 122 on the NFET region 110. Following the deposition of the hardmask 140, the exposed fin structures 135 and, more specifically, the exposed regions/portions 125, e.g., SiGe regions, of the fin structures 122 on the PFET region 105 will undergo an ion plasma doping process. In embodiments, the energy level utilized in the ion plasma doping process is dependent upon the required doping levels. As an example, though, the energy levels can be in a range of about $5^{e14}$-$5^{e15}$ with a concentration in a range of about $5^{e20}$-$1^{e21}$. Again, the blocking layer 130 will prevent diffusion of the dopants into the lower portion of the fin structures 135 on the PFET region 105. In embodiments, the doping process can also occur post spacer deposition, e.g., SiN, SiOCN spacer deposition.

Figure 3:
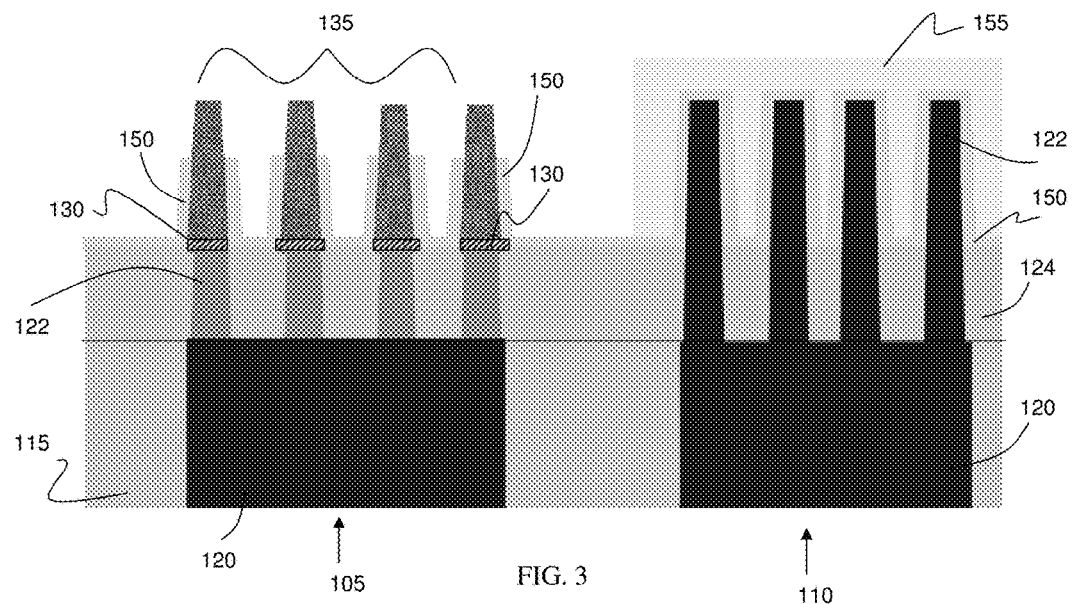
FIG. 3 shows the fin structures with spacers, amongst other features, and respective fabrication processes in accordance with aspects of the present disclosure.

In FIG. 3, a spacer material 150 is deposited on the exposed fin structures 135 and fin structures 122 across both the PFET region 105 and NFET region 110. The spacer material 150 can be composed of any suitable insulator material, e.g., SiN/SiOCN. In embodiments, the spacer material 150 can be deposited using a CVD process, as an example. Following the deposition of the spacer material 150, a hardmask 155 can be provided on the fin structures 122 on the NFET region 110 to protect the spacer material 150 during subsequent etching processes. Alternatively, the driving of the dopants into the exposed fin structures 135, e.g., SiGe regions 125, can occur post deposition of the spacer material 150.

In embodiments, the spacer material 150 on the PFET region 105 is pulled down by using a conventional anisotropic etching process. Depending on the epitaxial layer that will be grown in later steps, the spacer material 150 can be etched down to certain heights, e.g., to about 5 nm to about 15 nm; although other dimensions are also contemplated herein. As noted above, the doping of the exposed portions of the fin structures 135 (to form source and drain regions) can occur post deposition of spacer material 150. Under this alternative approach, the dopant is driven into the spacer material 150, allowing for a lower-k potential.

Figure 4:
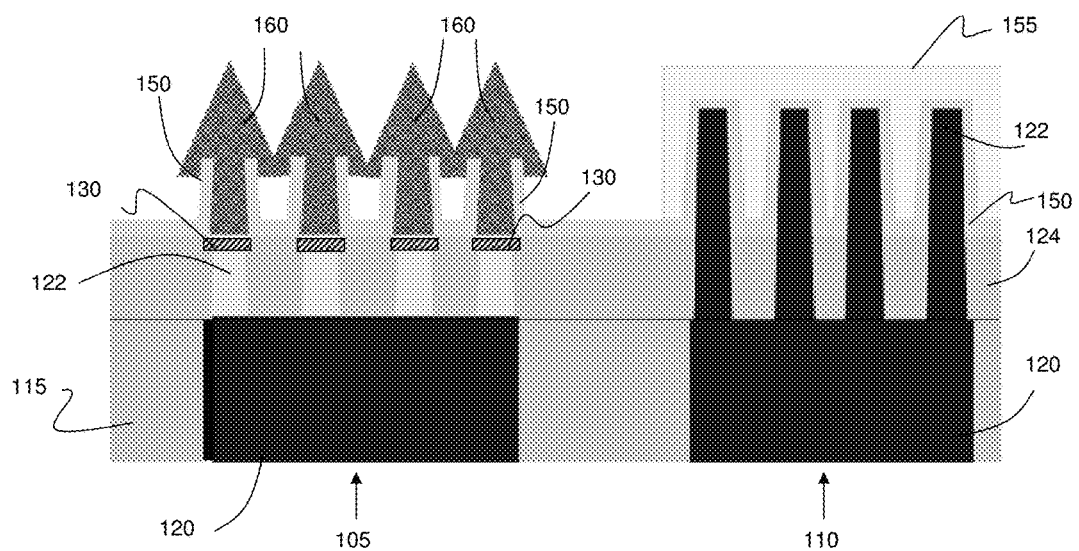
FIG. 4 shows the fin structures with epitaxial S/D regions, amongst other features, and respective fabrication processes in accordance with aspects of the present disclosure.

In FIG. 4, the doped exposed fin structures 135 on the PFET region 105 are merged together by an epitaxial growth process to form raised doped source and drain regions 160, i.e., SiGe:B doped merged portions 160. In embodiments, the doped source regions and the doped drain regions 160 can each be merged by the growth process, with the spacer material 150 preventing the epitaxial material from growing on sides of the exposed fin structures 135. In embodiments, the doped source and drain regions 160 can also be separate structures (e.g., unmerged) depending on the growth process, e.g., growth time, and fin pitch of the exposed fin structures 135. Following the growth process, gates structures can be formed over the fin structures, e.g., doped source and drain regions 160, using conventional deposition and patterning process, as should be known to those of skill in the art. Again, a hardmask 155 can be provided on the fin structures 122 on the NFET region 110.

Figure 5:
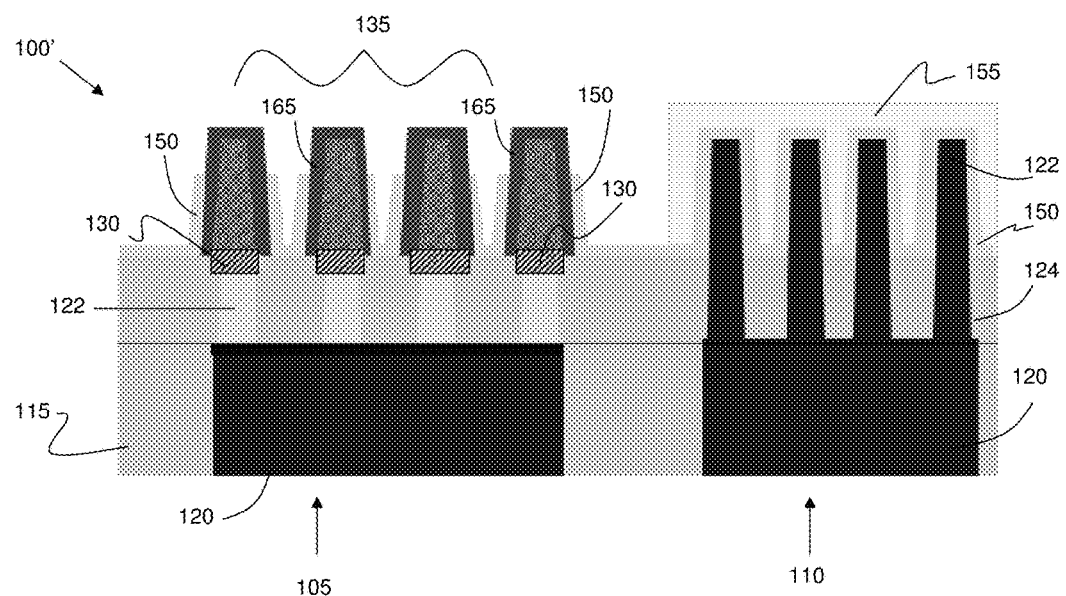
FIG. 5 shows cladded fin structures, amongst other features, and respective fabrication processes in accordance with aspects of the present disclosure.

FIG. 5 shows an alternative structure beginning from either FIG. 2A or FIG. 2B. In this structure 100', a SiGe:C cladding layer 165 is formed on the exposed fin structures 135, post doping processes, on the NFET region 110 of the structure. In embodiments, the SiGe:C cladding layer 165 can have a thickness of about 2 nm to about 3 nm. The spacer material 150 is deposited on the SiGe:C cladding layer 165 and subsequently pulled down by using a conventional anisotropic etching process as described herein. As should be understood by those of skill in the art, the SiGe:C cladding layer 165 will prevent boron diffusion from outgassing from the doped fin structures 135 and into the spacer material 150. Again, a hardmask 155 can be provided on the fin structures 122 on the NFET region 110.

Figure 6:
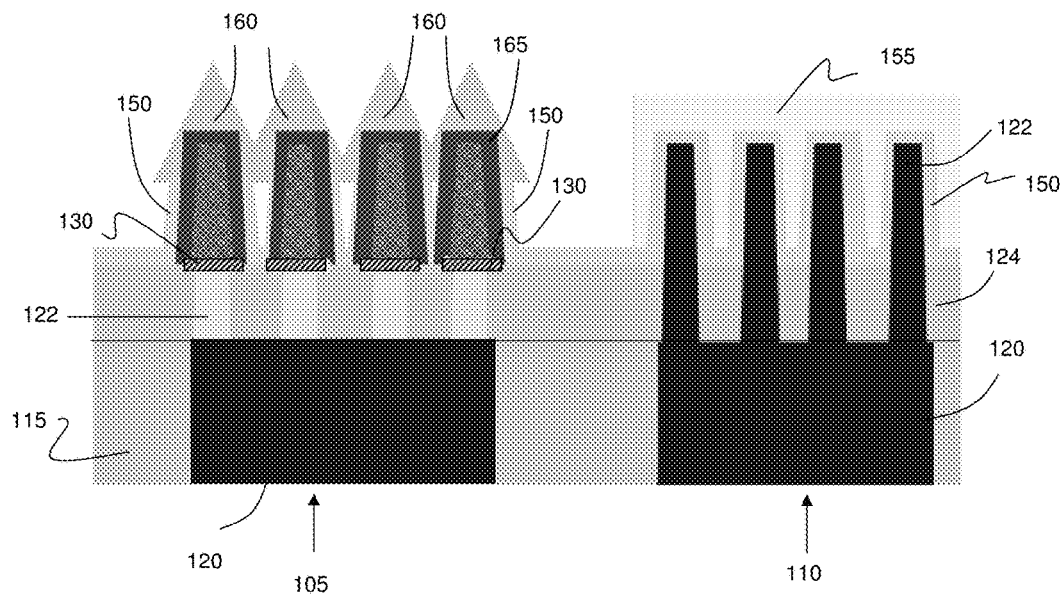
FIG. 6 shows epitaxial S/D regions formed on the structure of FIG. 5, amongst other features, and respective fabrication processes in accordance with aspects of the present disclosure.

In FIG. 6, the exposed fin structures 135 on the PFET region 105 are merged together by an epitaxial growth process to form doped source and drain regions 160, i.e., SiGe:B doped merged portions of the fin structures 160. In embodiments, the doped source and drain regions 160 can be merged together by the growth process, with the spacer material 150 preventing the epitaxial material from growing on sides of the fin structures 135. In embodiments, the doped source and drain regions 160 can be separate (e.g., unmerged) depending on the growth process, e.g., growth time, and fin pitch of the doped fin structures 135. Again, a hardmask 155 can be provided on the fin structures 122 on the NFET region 110.

Figure 7:
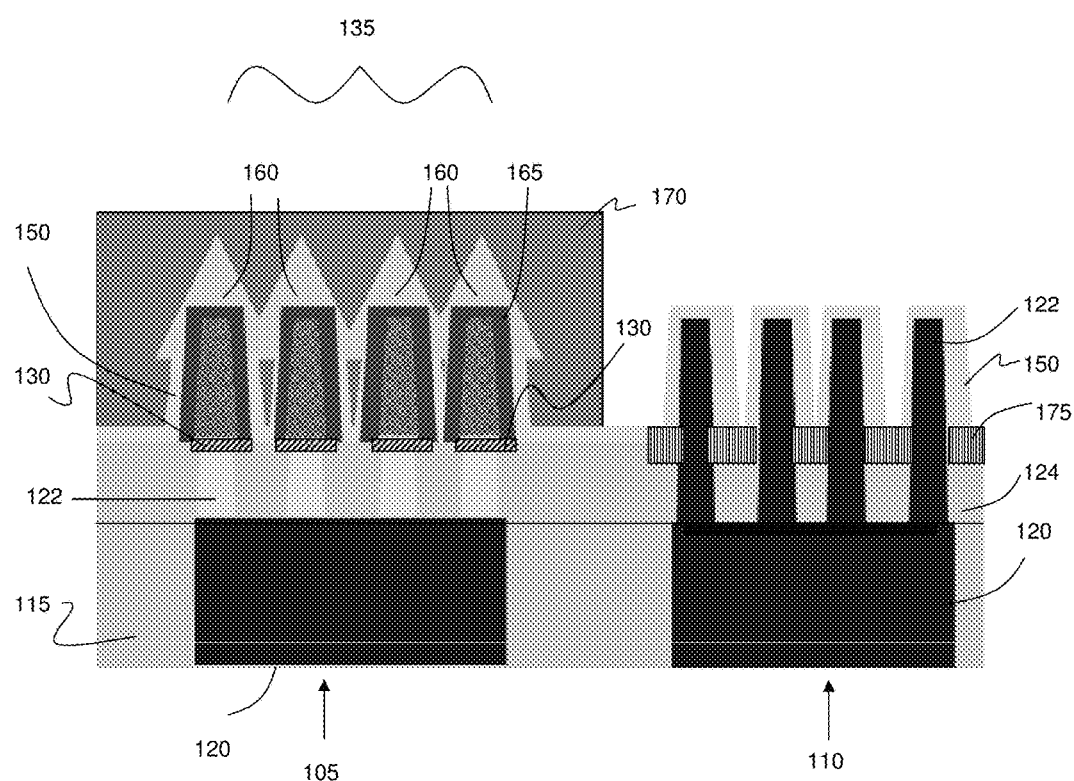
FIG. 7 shows embedded source/drain regions, amongst other features, and respective fabrication processes in accordance with aspects of the present disclosure.

In embodiments, as shown in FIG. 7, blocking material 170 is formed on the PFET region 105 to protect the doped source and drain regions 160, e.g., fin structures 135. A conventional source and drain etching is performed between the fin structures 122, using a selective etch chemistry to the oxide material 124, e.g., dielectric material. In this process, sidewalls of the fin structures 122 are exposed. Source and drain material is formed in the cavity to form source and drain regions 175. In embodiments, the source and drain material can be doped semiconductor material, grown from the sidewalls of the exposed fin structures 122. In this way, an embedded source region and drain region can be formed on the NFET region 110 of the device. Following the source and drain region formation for both the NFET region 110 and the PFET region 105, gates structures can be formed over the fin structures, e.g., doped source and drain regions 160 and source and drain region 175, using conventional deposition and patterning process, as should be known to those of skill in the art.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a plurality of fin structures comprising doped source and drain regions with a diffusion blocking layer between the doped source and drain regions and an underlying fin region formed within a dielectric material, and cladding material on sidewalls of the plurality of fin structures, with recessed sidewalls on the cladding material.

2. The structure of claim 1, wherein the doped source and drain regions are raised source and drain regions composed of doped SiGe material.

3. The structure of claim 1, wherein the doped source and drain regions are boron doped regions.

4. The structure of claim 1, wherein the diffusion blocking layer is composed of SiC formed between the doped source and drain regions and a lower region of the plurality of fin structures forming the underlying fin region.

5. The structure of claim 4, wherein the doped source and drain regions are composed of epitaxial grown semiconductor material on the diffusion blocking layer.

6. The structure of claim 5, wherein the epitaxial grown semiconductor material is merged together to form merged source regions and merged drain regions respectively.

7. The structure of claim 6, wherein the recessed sidewalls on the plurality of fin structures prevent epitaxial growth of the semiconductor material.

8. A structure comprising:
a first plurality of fin structures comprising:
a fin region composed of a first material in a dielectric material;
doped source and drain regions above the dielectric material; and
a diffusion blocking layer between the fin region and the doped source and drain regions;
a second plurality of fin structures devoid of the blocking layer;
recessed sidewalls above the diffusion blocking layer; and
a cladding material under the recessed sidewalls.

9. The structure of claim 8, wherein the first plurality of fin structures are formed on a PFET region of a device and the second plurality of fin structures are formed on an NFET region of the device.

10. The structure of claim 8, wherein the diffusion blocking layer is composed of SiC formed between the doped source and drain regions and a lower region of the first plurality of fin structures.

11. The structure of claim 8, wherein the doped source and drain regions are raised source and drain regions composed of doped SiGe material.

12. The structure of claim 8, wherein the doped source and drain regions are composed of epitaxial grown SiGe material.

13. The structure of claim 8, wherein the doped source and drain regions are doped merged epitaxial regions.

14. The structure of claim 8, wherein the doped source and drain regions are boron doped.

15. The structure of claim 8, wherein the blocking layer is composed of SiC.

* * * * *